US008368050B2

(12) United States Patent
Fattal et al.

(10) Patent No.: US 8,368,050 B2
(45) Date of Patent: Feb. 5, 2013

(54) PLASMON ENHANCED LIGHT-EMITTING DIODES

(75) Inventors: David A. Fattal, Mountain View, CA (US); Michael Renne Ty Tan, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 113 days.

(21) Appl. No.: 12/864,210

(22) PCT Filed: Jan. 30, 2008

(86) PCT No.: PCT/US2008/001319
§ 371 (c)(1),
(2), (4) Date: Jul. 22, 2010

(87) PCT Pub. No.: WO2009/096919
PCT Pub. Date: Aug. 6, 2009

(65) Prior Publication Data
US 2010/0301307 A1    Dec. 2, 2010

(51) Int. Cl.
H01L 29/06    (2006.01)
(52) U.S. Cl. .................... 257/14; 257/E33.013
(58) Field of Classification Search .............. 257/13, 257/14, 191, 9, E33.005, E33.013, E33.008, 257/E33.069, E29.09, E29.188, E33.001
See application file for complete search history.

(56) References Cited

U.S. PATENT DOCUMENTS

| 4,160,931 | A | 7/1979 | Lambe |
| 6,534,798 | B1 | 3/2003 | Scherer |
| 6,670,772 | B1 | 12/2003 | Arnold |
| 6,946,674 | B2 | 9/2005 | Nagao |
| 7,010,183 | B2 | 3/2006 | Estes |
| 7,122,955 | B2 | 10/2006 | Tseng |
| 2005/0285128 | A1 | 12/2005 | Scherer |
| 2007/0171949 | A1* | 7/2007 | Jikutani ............... 372/46.015 |
| 2007/0221908 | A1* | 9/2007 | Takahashi et al. ............ 257/13 |
| 2007/0280322 | A1* | 12/2007 | Sato et al. ................ 372/50.11 |
| 2008/0023688 | A1* | 1/2008 | Johnson ......................... 257/13 |

FOREIGN PATENT DOCUMENTS

| EP | 1054290 | 11/2000 |
| EP | 1054290 | 2/2005 |

(Continued)

OTHER PUBLICATIONS

IEEE Journal of Quantum Electronics, vol. 36, No. 10, Oct. 2000 "Surface Plasmon Enhanced Light-Emitting Diode" Jelena Vuckovic, Marko Loncar, and Axel Scherer.*

Primary Examiner — Ha Tran T Nguyen
Assistant Examiner — Vongsavanh Sengdara

(57) ABSTRACT

Embodiments of the present invention are directed to light-emitting diodes. In one embodiment of the present invention, a light-emitting diode comprises at least one quantum well sandwiched between a first intrinsic semiconductor layer and a second semiconductor layer. An n-type heterostructure is disposed on a surface of the first intrinsic semiconductor layer, and a p-type heterostructure is disposed on a surface of the second intrinsic semiconductor layer opposite the n-type semiconductor heterostructure. The diode also includes a metal structure disposed on a surface of the light-emitting diode. Surface plasmon polaritons formed along the interface between the metal-structure and the light-emitting diode surface extend into the at least one quantum well increasing the spontaneous emission rate of the transverse magnetic field component of electromagnetic radiation emitted from the at least one quantum well. In certain embodiments, the electromagnetic radiation can be modulated at a rate of about 10 Gb/s or faster.

19 Claims, 12 Drawing Sheets

FOREIGN PATENT DOCUMENTS

| | | |
|---|---|---|
| JP | 1998-321960 | 12/1998 |
| JP | 2000-323787 | 12/2000 |
| JP | 2005-108982 | 4/2005 |
| JP | 2008-227544 | 9/2008 |

* cited by examiner

PLASMON ENHANCED LIGHT-EMITTING DIODES

TECHNICAL FIELD

This application is a U.S. National Phase application under 35U.S.C. § 371of International Application No. PCT/US08/01319, filed on Jan. 30, 2008. Embodiments of the present invention are directed to optoelectronic devices, and, in particular, to light-emitting diodes enhanced via surface plasmon polaritons.

BACKGROUND

The microelectronics industry has been driven by the ever increasing demand for small, high-performance, low-power consumption microelectronic devices. Microelectronics manufacturers can, for example, fabricate microprocessor transistors with dimensions on the order of 50 nm. However, there is a relatively large delay in transmitting digital information across these microprocessors and, in general, transmitting digital information between computational and storage devices located on the same circuit board. Although copper and aluminum wire interconnects have traditionally been used to carry digital information, increasing the number of electronic interconnects to satisfy the number of connections needed by an exponentially growing number of nanoscale electronic devices has been insufficient. Unlike transistors, for which performance improves with scaling, the delay caused by a corresponding increase in the number of electronic interconnects has increased and has become a substantial bottleneck in the speed of digital circuits.

Optical interconnects using optical fibers and polymer waveguides have been proposed as alternatives to electronic interconnects. For example, a single fiber optic cable can carry terabits per second of digital information encoded in channels or different wavelengths of light with a capacity of about 1000 times greater than transmitting the same information using electrical cables. The term "light" is not limited to electromagnetic radiation with wavelengths that lie in the visible portion of the electromagnetic spectrum but is also used to refer to electromagnetic radiation with wavelengths outside the visible portion, such as the infrared and ultraviolet portions, and can be used to refer to both classical and quantum electromagnetic radiation. Semiconductor lasers and light-emitting diodes ("LEDs") are two commonly used light sources for optical communication. However, the configuration and operation of these sources are fundamentally different and the difference in performance and cost can be significant factors in determining which source to use. In general, semiconductor lasers and LEDs employ semiconductor materials, but the primary difference is in the manner of operation and in the internal structures that control their operation. The following is a general and brief description of structural and operational similarities and differences between LEDs and semiconductor lasers.

An LED is a semiconductor p-i-n junction diode that emits incoherent narrow-spectrum light when electrically biased in the forward direction. This effect is a form of electroluminescence. FIG. 1 shows a schematic representation and cross-sectional view of an LED 100. The LED 100 comprises an intrinsic or undoped region 102 sandwiched between a p-type semiconductor region 104 and an n-type semiconductor region 106. Electrodes 108 and 110 are connected to the regions 104 and 106, respectively. Regions 104 and 106 can be wider (direct or indirect) electronic bandgap semiconductors while the region 102 can be a narrower, direct bandgap semiconductor, thus forming a double heterostructure p-i-n junction. The p-type region 104 is doped with impurity or electron acceptor atoms having fewer electrons than the atoms they replace in the semiconductor compound, which creates holes or vacant electronic energy states in the valance band of the p-type region 104. On the other hand, the n-type region 106 is doped with impurities or electron donar atoms that donate electrons to the semiconductor, which leaves extra electrons in the electronic energy states of the conduction band of the n-type region 106. A depletion regions forms in region 102 forms as a result of the difference in chemical potential between the p-type and n-type semiconductor regions 104 and 106. This built-in potential difference is an equilibrium condition that impedes the flow of electrons and holes between the p- and n-type regions 104 and 106. This potential difference must be overcome before current can flow through the diode.

FIGS. 2A-2B show electronic energy band diagrams for the regions 102, 104 and 106. In FIGS. 2A-2B, heavily shaded regions, such as region 202, represent mostly filled electronic energy states and lightly shaded regions, such as region 204, represent mostly vacant electronic energy states called "holes" which act like positive charge carriers. Electrons and holes are called "charge carriers." Electron donor impurities create electronic states near the conduction band while electron acceptors create electronic states near the valence band. Thus, as shown in FIG. 2A, the valance and conduction bands associated with the p-doped region 104 are higher in electronic energy than the valance and conduction bands associated with n-doped region 106. Depending on the size of the band gap energies associated with the regions 102, 104, and 106, some electrons can be thermally excited into mostly empty conduction bands as indicated by regions 206 and 208. At zero bias, the region 102 has a relatively low concentration of electrons in the conduction band and an equal number of holes in the valance band. FIG. 2A also reveals steep conduction and valance bands associated with the region 102 which prevent holes and electrons from migrating from the neighboring p- and n-doped regions 104 and 106, respectively. However, when a forward bias is applied to the LED 100, electrons are injected into the n-doped region 106 and holes are injected into the p-doped region 104. Thus, the electronic energy band diagram changes accordingly as shown in FIG. 2B. The steep potential associated with the region 102 flattens. Electrons are injected into the conduction band of the region 102 from the n-type region 106, while holes are injected into the valance band of the region 102 from the p-type region 104. Note the number of electrons and holes remains the same. The relatively higher electronic bandgap energies of the regions 104 and 106 serve to confine the injected carriers to the intrinsic region 102. Electrons spontaneously recombine from the bottom of the conduction band 210 with holes in the top of the valance band 212 in a radiative process called "electron-hole recombination" or "recombination," emitting photons of light with an energy:

$$E = h\nu \geq E_g$$

where h is Plank's constant, and v is the frequency of the light emitted. As long as an appropriate voltage is applied in the same forward bias direction, population inversion is maintained, electrons and holes flow through the diode and spontaneously recombine at the junction 102, and light is emitted with the frequency v in nearly all directions from the LED 100.

A semiconductor laser, on the other hand, includes a gain medium, a pump, and feedback that can be created by placing the gain medium in a laser cavity. FIG. 3 shows a schematic representation and cross-sectional view of a semiconductor diode laser 300. The gain medium of the laser 300 comprises an intrinsic region with one or more quantum wells 302 sandwiched between a p-type region 304 and an n-type region 306, as described above with reference to the LED 100. The laser 300 also includes a cavity formed by a fully reflective mirror 308 and a partially reflective mirror 310. The mirrors 308 and 310 provide the feedback needed to produce a coherent beam of light. Pumping the gain medium causes carriers to be injected into the conduction band and holes into the valance band in process called "population inversion," However, unlike the LED, the spontaneous emission of light with frequency v is reflected back into the gain medium by the mirrors 308 and 310. The light produced by the spontaneous emission stimulates the emission of more light with frequency v, and the stimulated emissions stimulates the emission of even more light with frequency v. The light is not absorbed and continues to build-up by bouncing hark and forth between the mirrors 308 and 310 with substantially the same direction, wavelength, and phase and constructively interferes to produce an amplified coherent beam of light with frequency v that leaks out of the partially reflective mirror 310 substantially parallel to the junction 302. Semiconductor lasers can be configured with layers having different refractive indexes to create Bragg reflectors that emit light perpendicular to the junction, such as vertical cavity surface emitting lasers ("VCSELs").

In general, LEDs emit light via spontaneous electron-hole recombination. In contrast, semiconductor lasers emit light primarily via stimulated electron-hole recombination, which is accomplished by having light already propagating through the gain medium. As a result, lasers can be modulated at much higher speeds than typical LEDs because the electron-hole recombination rate is enhanced by stimulated emission, while in LEDs, spontaneous electron-hole recombination is a much slower process. On the other hand, pre-populating the laser cavity with photons has an energy cost measured in terms of the laser threshold. LEDs do not have a threshold and can be operated at a lower input power and simpler drive circuitry.

The relatively high cost of semiconductor lasers used in optoelectronic devices is, however, a factor limiting their widespread use. For example, in many high-speed optical communication systems, the highest cost element is the laser. VCSELs are an example of a laser that can be used in optical communication links of less than about 300m. Although VCSELs are reliable and efficient and are capable of modulation rates in excess of 10 Gb/s, the cost of implementing VCSELs in computational and communications devices can be prohibitive.

LEDs may provide a reliable inexpensive alternative to lasers, because typical LEDs cost about 1000 times less than high-speed VCSELs. However, when comparing the performance of LEDs to lasers, LEDs have a number of serious limitations including modulation speeds of less than 800 Mb/s, wide spectral linewidth of approximately 30 nm of full-width-at-half-maximum, low efficiency, and a lambertian radiation pattern.

DETAILED DESCRIPTION

Various embodiments of the present invention are directed to surface plasmon polariton ("SPP") enhanced LEDs. The LEDs include at least one tensile strained quantum well ("QW") as the light source. The spontaneous emission ("SE") rate of the QWs is not an intrinsic property of the QWs, but instead depends on the electromagnetic environment of the QWs. LED embodiments of the present invention exploit this phenomenon by positioning the QWs in close proximity to a metal structure disposed on the surface of the LED. The metal-LED interface supports the formation of SPPs with electron-plasma oscillations extending into the QWs. These electron-plasma oscillations increase the electron-hole pair recombination rate (i.e., the SE rate) within the QWs via the Purcell effect. Certain SPP-enhanced LED embodiments emit light over a range of wavelengths near 800 nm using tensile strained QWs that are disposed about 20-30 nm away from the metal-LED interface. These SPP-enhanced LEDs can emit light with a modulation speed of about 10 Gb/s or faster while maintaining a radiative efficiency above about 20%, which compares well with the modulation speeds and efficiencies of VCSELs and other semiconductor lasers. Unlike typical SPP-enhanced LEDs, the SPPs produced by LED embodiments of the present invention have a longer life-time, can propagate over distances of several wavelengths along the metal-LED interface, and can be re-radiated into free space.

In order to assist readers in understanding QWs and tensile strained QWs, an overview of QWs and tensile strained QWs is provided in a first subsection. Various system embodiments of the present invention are described in a second subsection.

Quantum Wells and Tensile Strained Quantum Wells

The outer electrons of semiconductor atoms are delocalized over the whole semiconductor crystal, and the wave functions corresponding to the outer electrons can be written as:

$$\psi(r) = u_k(r)\exp[j(k \cdot r)]$$

where $u_k(r)$ represents the periodicity of the crystal lattice, k is the wavevector, k is the wavenumber ($k^2 = k \cdot k$), and r is the coordinate vector in the semiconductor. The corresponding electronic energy E is a function of k and these energy values fall within allowed energy bands. For the sake of simplicity, only the highest filled band, the valance band, and the next higher band, the conduction band, are described. Within the parabolic band approximation, the valance and conduction bands can be approximated by parabolas.

Figure 4:
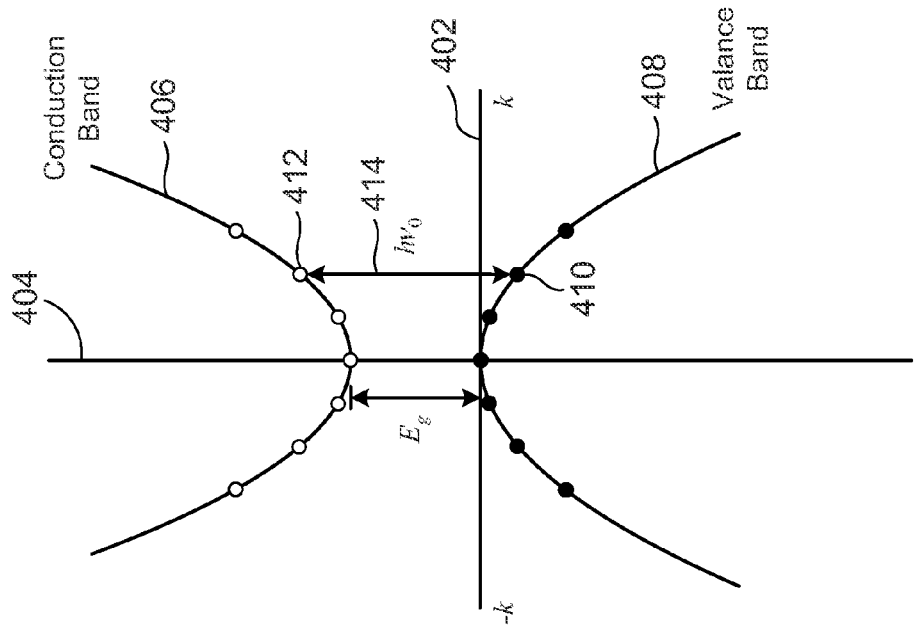
FIG. 4 shows a plot of a valance band and a conduction band for a direct semiconductor.

FIG. 4 shows a plot of a valance band and a conduction band for a direct semiconductor. In FIG. 4, a horizontal axis 402 represents the wavenumber k, a vertical axis 404 represents the energy E, a parabola 406 represents the conduction band, and a parabola 408 represents the valance band. The energy of the conduction band 406 can be represented by the parabolic equation:

$$E_c = E_g + \frac{\hbar^2 k^2}{2m_c}$$

where $m_c = h^2/(d^2 E_c/dk^2)$ is the effective mass of a electron at the bottom of the conduction band 406, h is Plank's constant h divided by $2\pi$, and $E_g$ is the band gap energy. The energy in the valance band 408 is measured from the top of the valance band downward and can be represented by the parabolic equation:

$$E_v = -\frac{\hbar^2 k^2}{2m_v}$$

where $m_v = h^2/(d^2 E_v/dk^2)$ is the effective mass of the electron at the top of the valance band 408.

Note that direct semiconductors are distinguished between from indirect semiconductors by the location of the valance band maximum relative to the location of the conduction band minimum. For direct semiconductors, the valance band maximum and the conduction band minimum occur at the same wavenumber, which is k equal to 0 for the valance and conduction bands shown in FIG. 4. In contrast, for indirect semiconductors, the valance band maximum and the conduction band minimum occur at different wavenumbers. Direct semiconductors can be formed from a combination of group IIIA elements of the period table, such as Al, Ga, and In, and group VA elements of the period table, such as N, P, As, and Sb, which are referred to as III-V compound semiconductors. Examples of such direct semiconductors include GaAs, ternary semiconductors AlGaAs, InGaP, and InGaAs, and quaternary semiconductor InGaAsP. Si and Ge are examples of indirect semiconductors.

The one-dimensional model of the valance band 408 and the conduction band 406 can be generalized to three-dimensions by letting $k_x$, $k_y$, and $k_z$ be components of the electron's wavevector k and assuming that the effective mass (i.e., band curvature) is the same along the x-, y-, and z-coordinate directions. A finite-sized, rectangular parallelepiped semiconductor crystal with finite dimensions $L_x$, $L_y$, and $L_z$ imposes boundary conditions on the total phase shift $k \cdot r$ across the crystal. Thus, the components of the wavevector are quantized as follows:

$$k_i = \left(\frac{2\pi l_i}{L_i}\right)$$

where i=x, y, z, and $l_i$ is an integer. In other words, the electronic energy states are quantized and represented by circles in the valance band 408, such as circle 410, and circles in the conduction band 406, such as circle 412. Filled circles represent electron filled electronic energy states and open circles represent holes or vacant electronic energy states.

The only radiative electronic transitions allowed between the conduction band 406 and the valance band 408 are those where the electronic energy states have the same wavenumber k and the electron spin is unchanged. In other words, the wavenumber k and the electronic spin state are unchanged for allowed electronic transitions between electronic energy states in the conduction band 406 and electronic energy states in the valance band 408. For example, as shown in FIG. 4, directional 414 represents an allowed electronic energy state transition between the electronic energy state 412 in the conduction band 406 and the electronic energy state 410 in the valance band 408 and the energy difference is given by:

$$h\nu_0 = E_g + \left(\frac{\hbar^2 k^2}{2m_r}\right)$$

where $m_r$ is the reduced mass given by $m_r^{-1} = m_c^{-1} + m_v^{-1}$. In order for an electron in the electronic energy state 410 to transition to the electronic energy state 412, the electron can be pumped with photons having a frequency $\nu_0$. When the electron spontaneously transitions, or is stimulated to transition, from the electronic energy state 412 to the electronic energy state 410, a photon is emitted with a frequency $\nu_o$.

Figure 1:
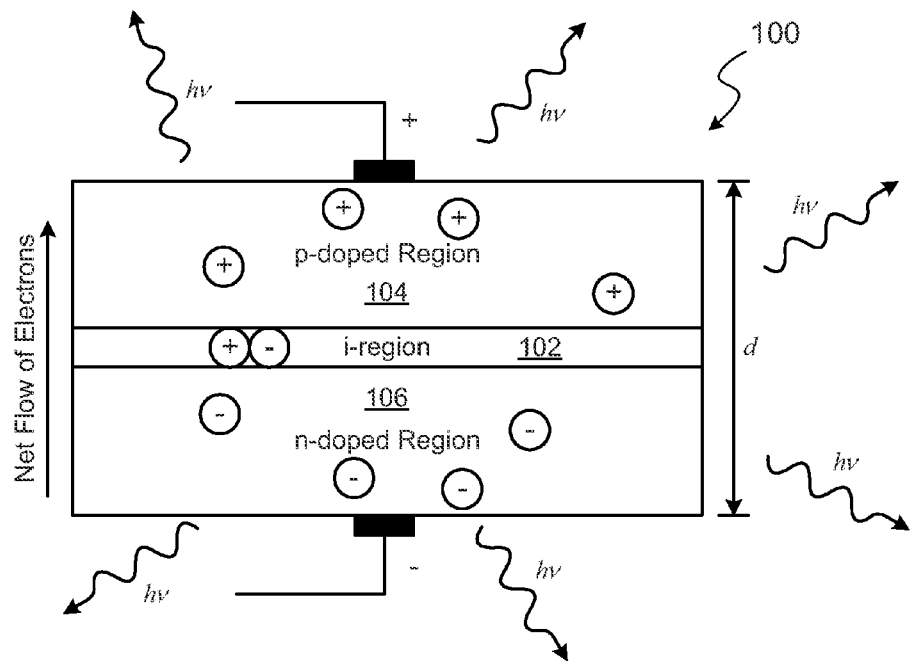
FIG. 1 shows a schematic representation and cross-sectional view of a light-emitting diode.
Figure 2A:
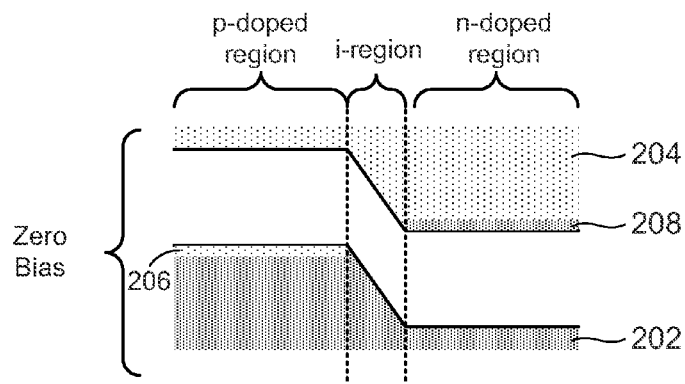
FIGS. 2A-2B show electronic energy band diagrams for a junction of a semiconductor diode.
Figure 2B:
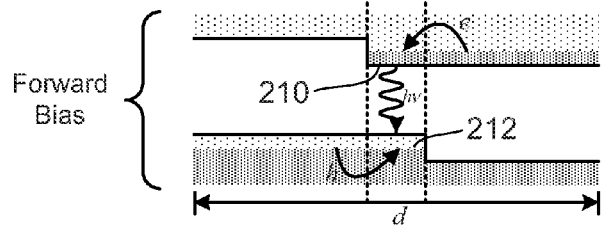
Figure 3:
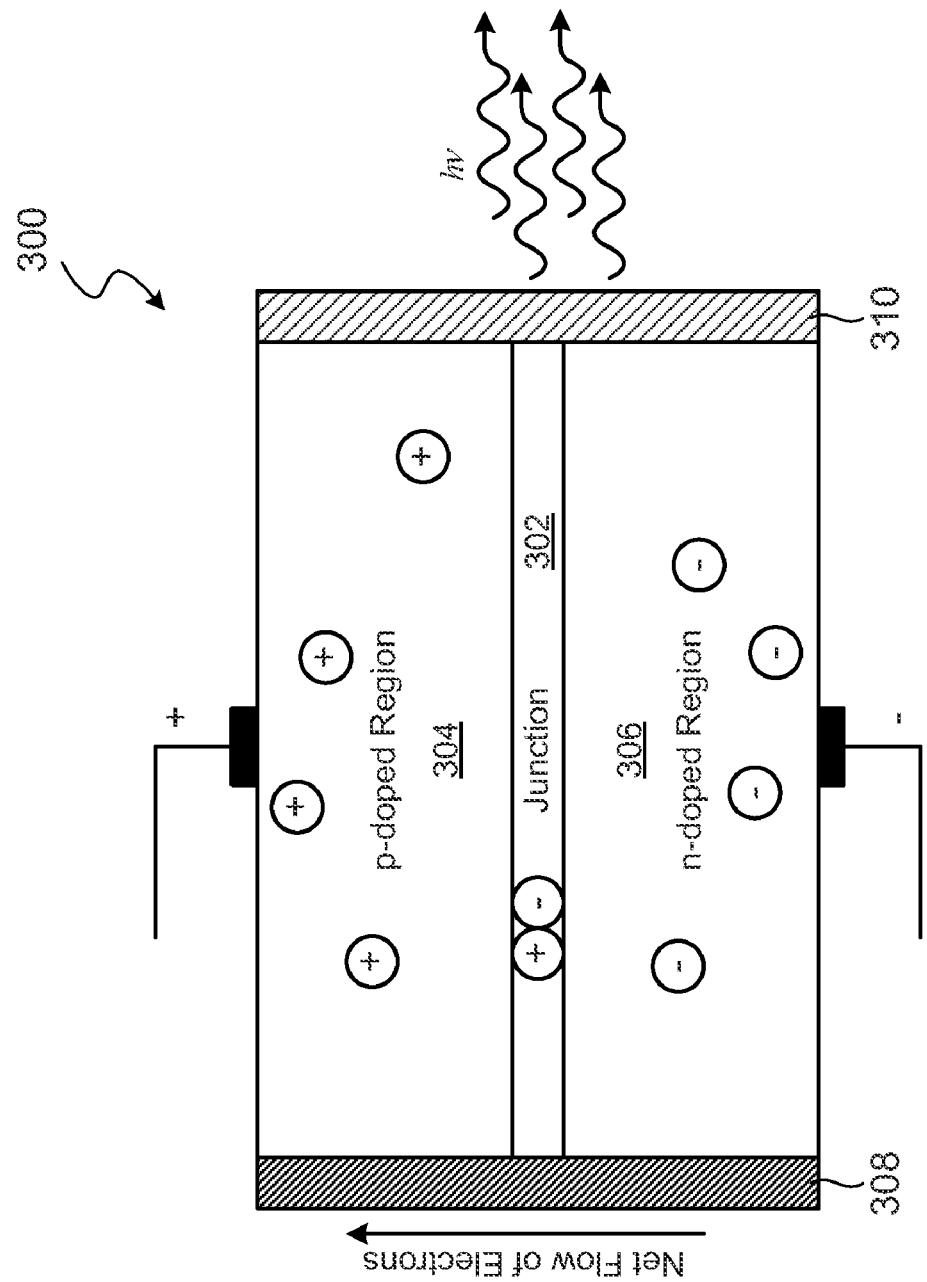
FIG. 3 shows a schematic representation and cross-sectional view of a semiconductor diode laser.
Figure 5:
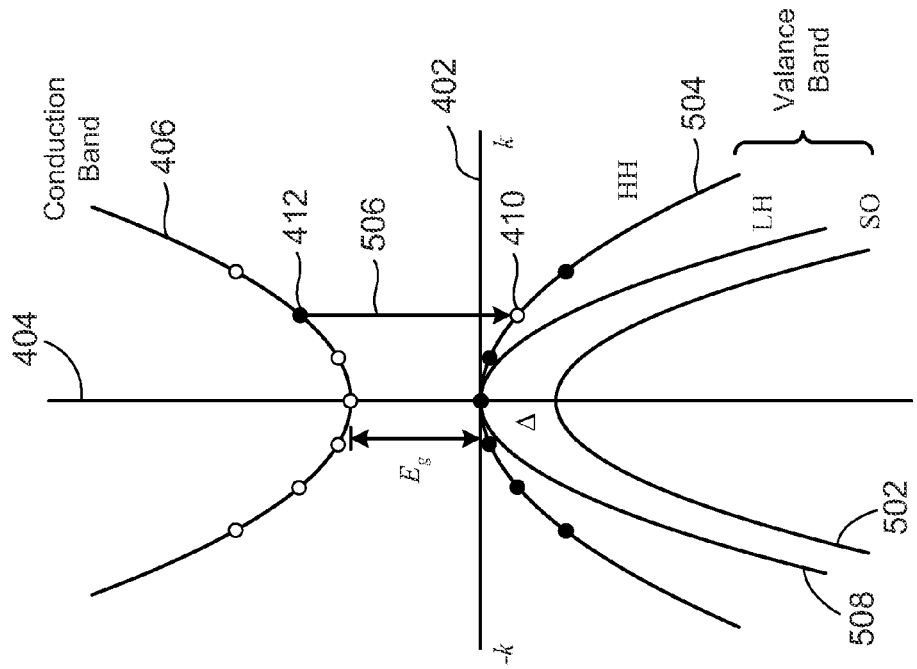
FIG. 5 shows a plot of a valance band structure of an unstrained direct semiconductor.

For direct semiconductors, there are actually three different types of bands associated with the valance band 408. The three bands are called a heavy hole ("HH") band, a light hole ("LH") band, and a split-off ("SO") band. FIG. 5 shows a valance band structure of an unstrained direct semiconductor. The split-off band 502 lies $\Delta$ lower in energy at k equal to 0, is always filled with electrons, and does not participate in radiative and nonradiative transitions originating from the conduction band 406. The effective mass $m_v$ of the valance band 408 equals the effective mass $m_{HH}$ of the HH band 504. As a result, the valance band 408 can be viewed as corresponding to the HH band 504 for electronic transitions from the conduction band 406 to holes in the valance band 408. For example, an electron in the electronic energy state 412 of the conduction band 406 transitions 506 to a hole 410 in the HH band 504. The LH band 508 shares the same energy as the HH band 504 at k equal to 0. However, because the effective mass $m_{LH}$ (i.e., curvature at k equal to 0) of the LH band 508 is much smaller than the effective mass $m_{HH}$ of the HH band 504, the density of states of light holes in the LH band 508 is a fraction of the density of states of heavy holes in the HH band 504. As a result, the LH band 508 does not accept electrons transitioning from the conduction band 406 and is typically ignored in comparison with the HH band 504.

Figure 6:
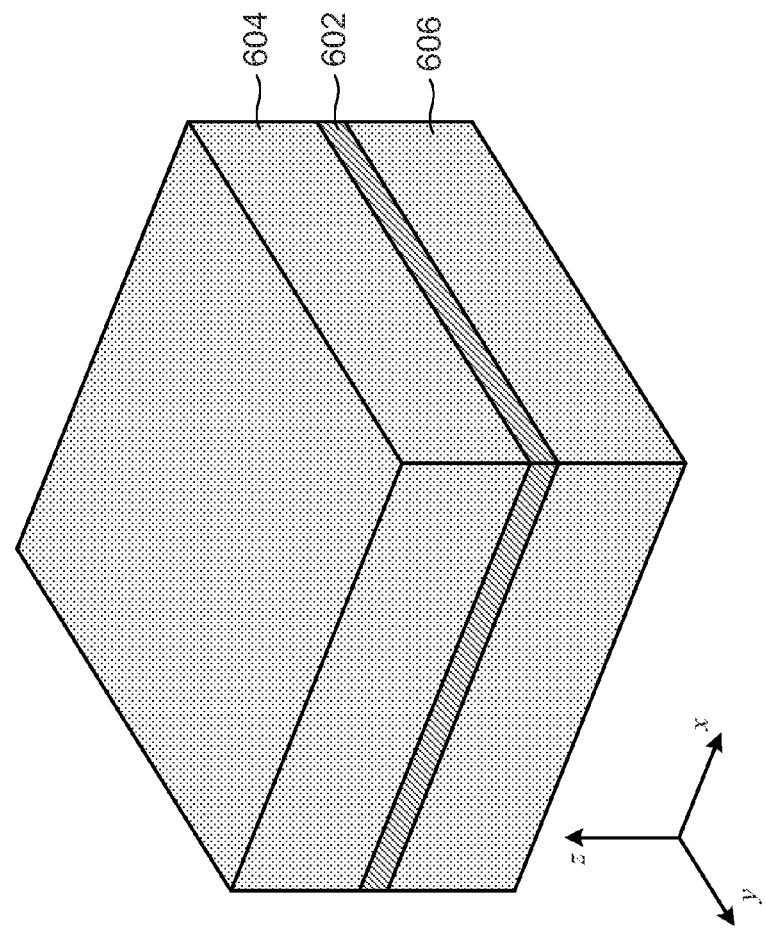
FIG. 6 shows an isometric view of a quantum well sandwiched between two thicker semiconductor layers.

In a QW semiconductor, a relatively thin layer of smaller electronic band gap energy semiconductor material $E_{g_1}$ ranging from about 5nm to about 20 nm thick is sandwiched between two relatively thicker layers of relatively larger electronic band gap energy semiconductor material $E_{g_2}$. FIG. 6 shows an isometric view of a QW 602 sandwiched between two relatively thicker semiconductor layers 604 and 606. Because $E_{g_2}$ is greater than $E_{g_1}$, potential wells are established for electrons at the top of the valance band of the QW 602, and potential wells are established for holes at the bottom of the conduction band of the QW 602. Due to the electron hole confinement in these potential wells, energy levels of electrons and holes exhibit quantum effects. The corresponding valance band and conduction band electron wave functions can be written as:

$$\psi_{c,v}(r_\perp) = u_k(r_\perp) \exp[j(k_\perp \cdot r_\perp)] \sin(n\pi z/L_z)$$

where $u_k(r_\perp)$ has the periodicity of the QW crystal lattice in the x,y plane, $k_\perp$ is the x,y plane wavevector, and $r_\perp$ is the QW coordinate vector in the x,y plane. The wave function $\psi_{c,v}(r_\perp)$ satisfies the boundary condition: $\psi_{c,v}$ equals 0 for z equal to 0 and for z equal to $L_z$. A finite-sized QW in the x,y plane imposes boundary conditions such that the total phase shift $k_\perp \cdot r_\perp$ across the crystal is a multiple integer of $2\pi$ and the wavevector $k_\perp$ components are quantized as follows:

$$k_i = \left(\frac{\pi l_i}{L_i}\right)$$

where i=x, y, and $l_i$ is an integer.

Within the parabolic band approximation, the energy states now include sub-band energy states that can be written as:

$$E_c = \frac{\hbar^2 k_\perp^2}{2m_c} + n^2 \frac{\hbar^2 \pi^2}{2m_c L_z^2}$$

for the conduction band, and as:

$$E_v = -\left(\frac{\hbar^2 k_\perp^2}{2m_v} + n^2 \frac{\hbar^2 \pi^2}{2m_v L_z^2}\right)$$

for the valance band, where n is a positive integer or quantum number corresponding to the sub-band energy states, $k_\perp$ is the wavenumber ($k_\perp^2 = k_\perp \cdot k_\perp$), and $\hbar^2 \pi^2/2m_{c,v}L_z^2$ is the energy of first QW state.

Figure 7:
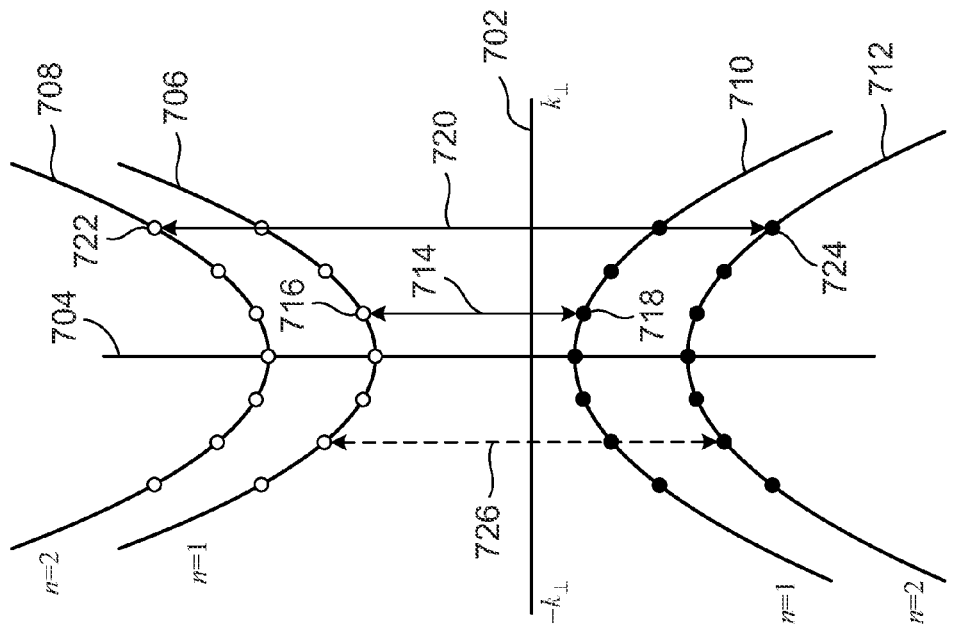
FIG. 7 shows a plot of two valance and conduction sub-bands associated with a quantum well.

FIG. 7 shows a plot of two valance and conductance sub-bands associated with a QW. In FIG. 7, a horizontal axis 702 represents the wavenumber $k_\perp$, a vertical axis 704 represents the electronic energy E, parabolas 706 and 708 represent the conduction sub-bands for n=1 and n=2, respectively, and parabolas 710 and 712 represents the valance sub-bands for n=1 and n=2, respectively. Because of the finite dimensionality of the QW, the electronic energy states of sub-bands are quantized. The available electronic states are represented by circles, where filled circles in the valance bands 710 and 712 represent electrons and open circle in the conduction bands 706 and 708 represent holes.

Only transitions between the conduction bands and valance bands with the same n, $k_\perp$, and electron spin states are allowed. For example, as shown in FIG. 7, a directional arrow 714 represents a first allowed electronic energy state transition between an electronic energy state 716 in the conduction band 706 and an electronic energy state 718 in the valance band 710, and a directional arrow 720 represents a second allowed electronic energy state transition between an electronic energy state 722 in the conduction band 708 and an electronic energy state 724 in the valance band 712. In contrast, a dashed-line directional arrow 726 represents an electronic energy state transition that is not allowed because the quantum numbers n associated with the conduction band 706 and the valance band 712 are different.

Due the relatively small thickness of the QW 602, shown in FIG. 6, the lattice constants for the QW 602 can differ significantly from the lattice constants of the layers 604 and 606. Introducing strain into the quantum well can be accomplished by growing the quantum well out of a material having a different lattice constant than the barrier layers. A QW with a larger lattice constant than the barrier layers results in a compressively strained QW, while a QW with a smaller lattice constant than the barrier layers results in a tensile strained QW. Since the electronic bandgap energy of a semiconductor is related to its lattice spacing, the strain introduced to the QW crystal lattice alters the electronic bandgap energy of the strained QW. In general, strain modifies both the conduction and valence band structure of the QW. For example, tensile strain (i.e., strain directed within the x,y plane) of the QW 602 changes the quantum properties of the QW 602 and changes the effective masses associated with the conduction band and the valance band structure. For a tensile strained QW, the quantum-size effects and the change in effective masses results in optical properties of the QW 602 that are markedly different from those of the same unstrained QW 602.

Figure 8:
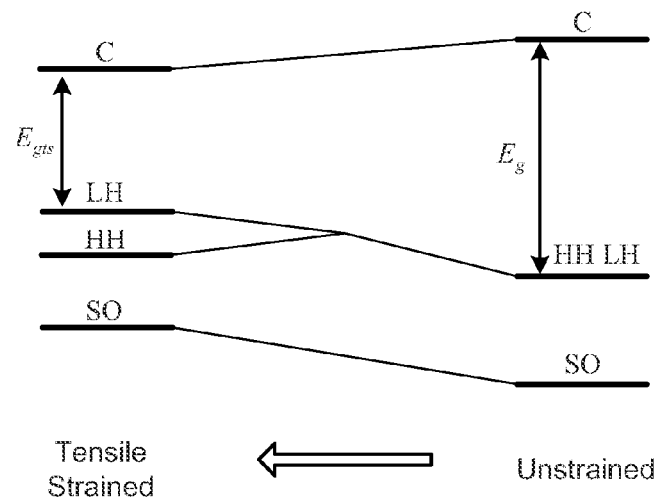
FIG. 8 shows how electronic energy levels of a direct semiconductor change under unstrained and tensile strained conditions.

FIG. 8 shows how electronic energy levels of a direct semiconductor change under unstrained and tensile strained conditions for $k_\perp$ equal to 0. As shown. in FIG. 8, tensile strain modifies the valance band structure of the QW 602 by splitting the LH band from the HH band and raising energy of the LH band above the HH band. FIG. 8 also reveals that the energy difference between the conduction band and the valance band of the QW under tensile strained conditions is different from that of the same QW under unstrained conditions. In other words, for $k_\perp$ equal to 0, the frequency $v_{gts}$ of the light ($E_{gts} = hv_{gts}$) emitted from the tensile strained QW is different from the frequency $v_g$ of the light ($E_g = hv_g$) emitted from the unstrained QW comprising the same semiconductor material.

Figure 9:
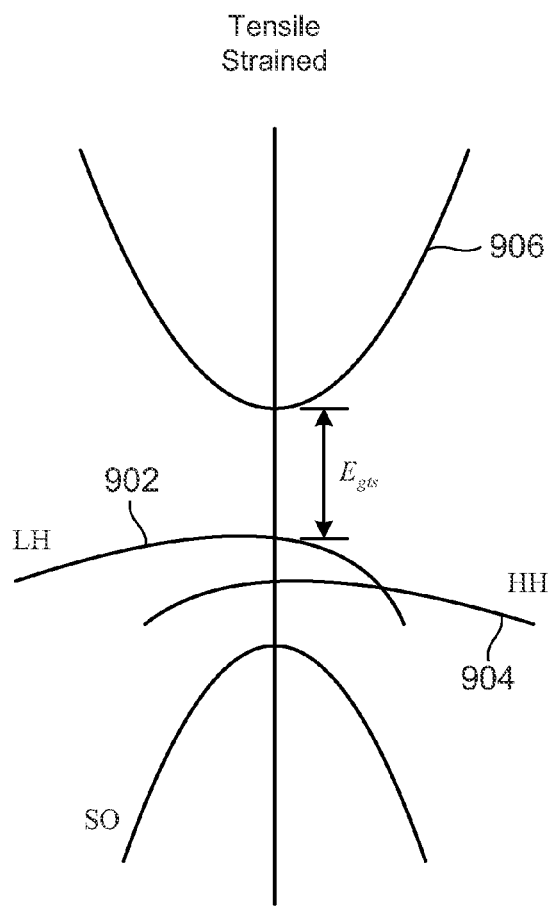
FIG. 9 shows a valance-band structure for a tensile strained quantum well.

FIG. 9 shows a valance-band structure for a tensile strained QW. Tensile strain raises the LH band 902 above the HH band 904 and causes the effective mass $m_{LH}$ (i.e., the curvature) of the LH band 902 to increase as compared to the unstrained case shown in FIG. 5. This enhances the conduction band 906 to LH band 902 transitions and generates predominantly transverse magnetic ("TM") component polarized light. The TM polarized light is emitted approximately perpendicular to the x,y plane of the QW 602, while the transverse electric ("TE") component is substantially absorbed within the x,y plane of the QW 602.

EMBODIMENTS OF THE PRESENT INVENTION

Figure 10:
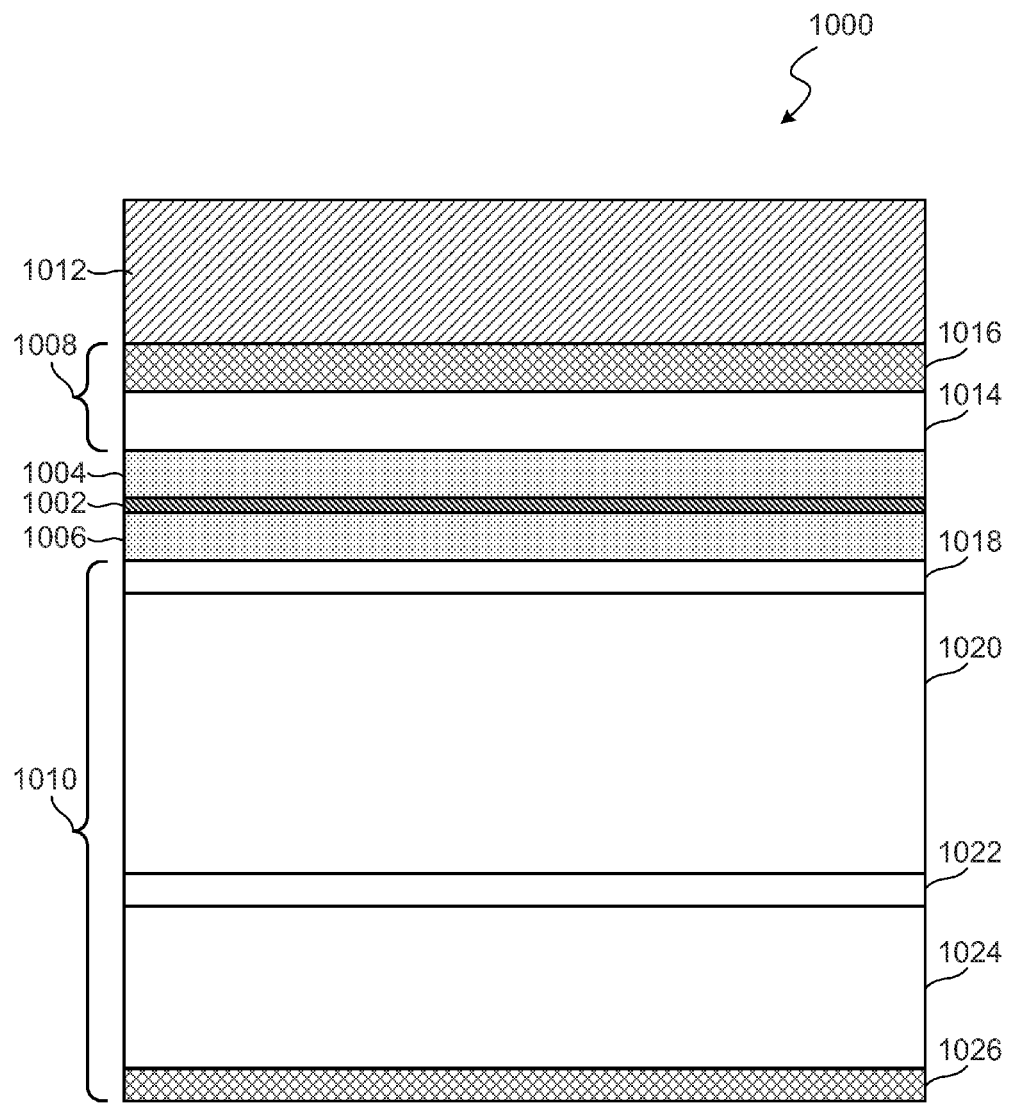
FIG. 10 shows a schematic representation and cross-sectional view of a first light-emitting diode configured in accordance with embodiments of the present invention.

FIG. 10 shows a schematic representation and cross-sectional view of an LED 1000 configured in accordance with embodiments of the present invention. The LED 1000 includes a QW 1002 sandwiched between a first semiconductor layer 1004 and a second semiconductor layer 1006. The first and second semiconductor layers 1004 and 1006 can be comprised of intrinsic, direct band gap semiconductor materials. Layers 1004 and 1006 have a relatively wider electronic bandgap than the barrier layers surrounding the QW 1002. These barrier layers serve to confine the electrons and holes to within the QW 1002. The LED 1000 includes an n-type heterostructure 1008 disposed on a surface of the first semiconductor layer 1004 and a p-type heterostructure 1010 disposed on a surface of the second semiconductor layer 1006. The LED 1000 also includes a metal structure 1012 disposed on a surface of the n-type heterostructure 1008. The QW 1002 is a direct bandgap semiconductor layer that is lattice mismatched to the lattice of the first and second semiconductor layers 1004 and 1006 in order to create tensile strain in the QW 1002.

As shown in FIG. 10, the n-type and p-type heterostructures 1008 and 1010 are comprised of layers. Each of these layers can be comprised of a differently doped or undoped direct or indirect band gap semiconductor material such that each layer has a different electronic band gap energy than an adjacent layer within the same heterostructure. Also, the different materials are chosen so that they are transparent to the photons generated in the quantum well 1002. For example, each layer can be comprised of a different wider bandgap III-V compound semiconductor. In particular, the n-type heterostructure 1008 comprises a first n-type semiconductor layer 1014 disposed on a surface of the first semiconductor layer 1004 and a second n-type semiconductor layer 1016 sandwiched between the first n-type semiconductor layer 1014 and the metal structure 1012. An n-type semiconductor is a semiconductor doped with electron donor impurities. The first n-type semiconductor layer 1014 can be composed of a semiconductor and dopant having an electronic band gap energy that is relatively greater than or equal to the electronic band gap energy of the second n-type semiconductor layer 1016. The p-type heterostructure 1010 comprises the following layers: a first compositionally graded semiconductor layer 1018 disposed on a surface of the second semiconductor layer 1006; a first p-type semiconductor layer 1020 disposed on a surface of the first graded semiconductor layer 1018; a second compositionally graded semiconductor layer 1022 disposed on a surface of the first p-type semiconductor layer 1020; a second p-type semiconductor layer 1024 disposed on a surface of the second graded semiconductor layer 1022; and a third p-type semiconductor layer disposed a surface of the second p-type semiconductor layer 1024. A p-type semiconductor is a semiconductor that has been doped with electron acceptor impurities. A compositionally graded semiconductor is one in which the electronic bandgap varies with position. This is achieved by changing the composition of the semiconductor. The graded regions are included to minimize the heterojunction discontinuities which reduce the series resistance between the semiconducting layers and improve the current flow. The first and second graded semiconductor layers 1018 and 1022 can be comprised of p-type semiconductor materials having a relatively larger electronic band gap energy than the adjacent first and second p-type semiconductor layers 1020 and 1024.

LED embodiments of the present invention are not limited to the metal structure/n-i-p arrangement of heterostructures described above with reference to Figure 10. In other words, LED embodiments are not limited to two n-type semiconductor layers comprising the n-type heterostructure 1008 and the five p-type semiconductor layers comprising the heterostructure 1010. In other embodiments, the layers 1016 and 1014 disposed between the first semiconductor layer 1004 and the metal structure 1012 can be doped with a p-type impurity giving a p-type heterostructure 1008 and the layers 1018-1026 can be doped with n-type impurities giving an n-type heterostructure 1010. In other words, the LED 1000 can have a metal structure/p-i-n arrangement of heterostructures.

The thicknesses of the individual layers comprising the LED 1000 can vary considerably in different embodiments. For example, the thicknesses of the LED layers can range as displayed in Table 1 below:

TABLE 1

| Layer | Thickness Range (nm) |
|---|---|
| QW 1002 | ≈5-20 |
| First semiconductor layer 1004 | ≈5-20 |
| Second semiconductor layer 1006 | ≈5-80 |
| First n-type semiconductor layer 1014 | ≈5-20 |
| Second n-type semiconductor layer 1016 | ≈5-20 |
| First graded semiconductor layer 1018 | ≈5-20 |
| First p-type semiconductor layer 1020 | ≈100-800 |
| Second graded semiconductor layer 1022 | ≈5-20 |
| Second p-type semiconductor layer 1024 | ≈100-700 |
| Third p-type semiconductor layer 1026 | ≈10-40 |

Figure 11:
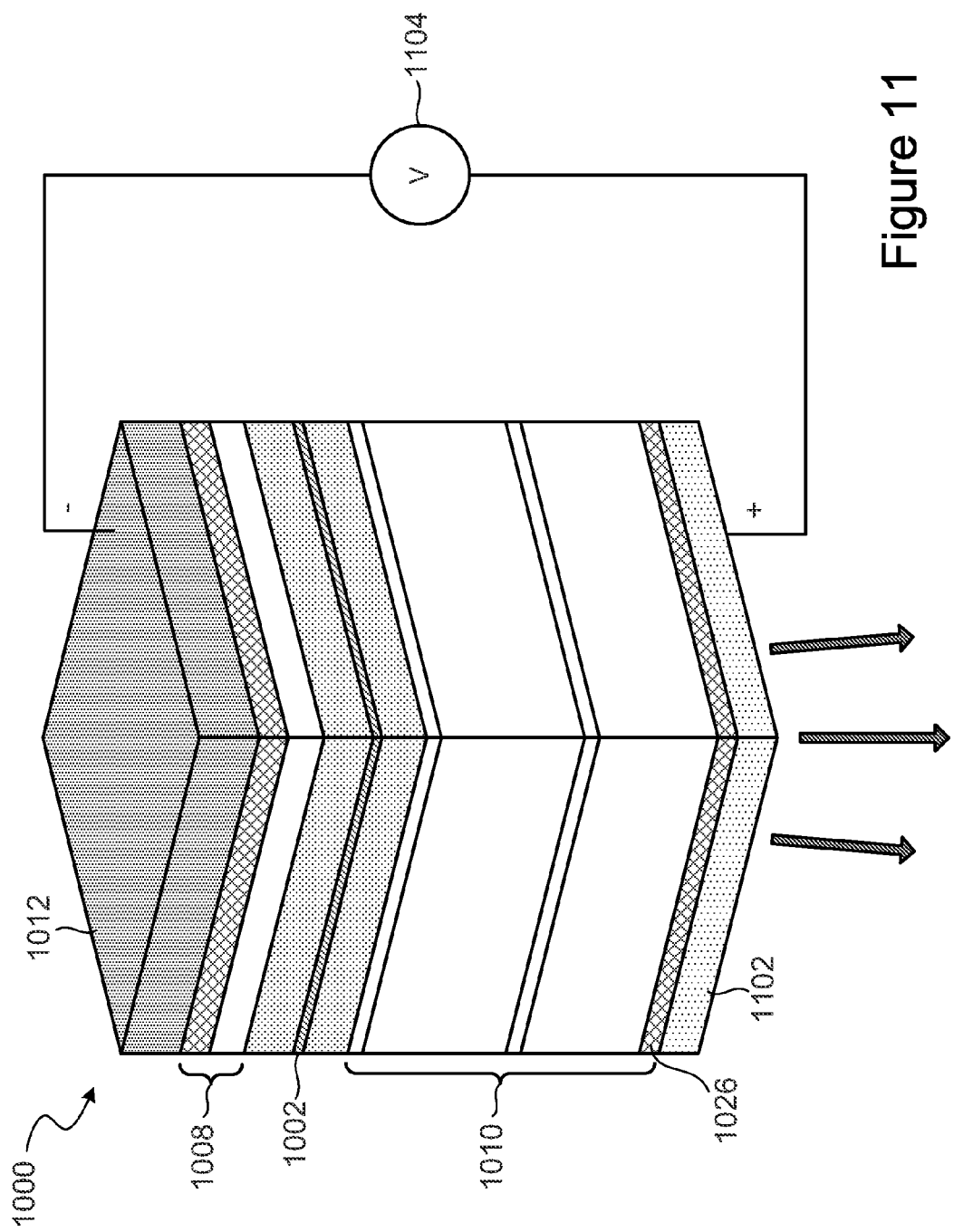
FIG. 11 shows an isometric view of the light-emitting diode, shown in FIG. 10, connected to a voltage source in accordance with embodiments of the present invention.

The LED 1000 can be operated by applying an appropriate voltage in a forward bias direction. FIG. 11 shows an isometric view of the LED 1000 and a schematic representation of the LED 1000 connected to a voltage source in accordance with embodiments of the present invention. As shown in FIG. 11, a layer 1102 is disposed on the outer surface of the third p-type semiconductor layer 1026 of the LED 1000, and a voltage source 1104 is connected to the metal structure 1012 and the layer 1102. The layer 1102 can be comprised of a material that is electrically conductive and optically transparent. For example, the layer 1102 can be indium tin oxide ("ITO") or another suitable conductive, transparent material. The voltage source 1104 is configured to supply a negative voltage to the n-type heterostructure 1008 and a positive voltage to the p-type heterostructure 1010. The negative voltage can be thought of as driving electrons toward the QW 1002, and the positive voltage can be thought of as driving holes toward the QW 1002. The QW 1002 is comprised of a direct bandgap semiconductor material having a relatively smaller electronic band gap energy $E_g$ than the remaining layers of the LED 1000. The voltage source 1104 can be configured to supply a voltage level that is large enough to inject electrons from the n-type heterostructure and holes from the p-type heterostructure into the QW 1002. Light generated by the QW 1002 is emitted from the QW 1002 and output from the LED 1000 through the layer 1102.

Note that the LED embodiments of the present invention are not limited to the rectangular box configuration shown in FIG. 11. LED embodiments can be formed into many different three-dimensional shapes including a cuboid, cylinder, n-sided prism, irregularly-shaped prism, a polyhedron, or any other suitable three-dimensional shape. Moreover, the surface of the LEDs may be roughened to eliminate total internal reflection ("TIR") at the semiconductor-air interface.

The recombining electron-holes pairs within the QW 1002 can be thought of as decaying dipoles. For purposes of describing the operation of the embodiments of the present invention, the terms "electron-hole pairs" and "dipoles" are interchangeable. In general, the SE rate of a decaying dipole depends not only on the dipole strength, but also on its electromagnetic ("EM") environment. By changing the EM environment near a dipole, the SE rate of the dipole can be tuned from completely suppressed emission to greatly enhanced emission, which is called the "Purcell effect." One way to understand the Purcell effect is to think of the EM environment as a collection of optical "modes" vibrating at a given frequency v corresponding to the dipole transition frequency.

In a bulk material, these modes are simply the collection of all plane EM waves of frequency v. The amount of radiative power that a dipole couples into a particular mode having an electric field E at the position of the dipole is proportional to $|d \cdot E|^2$, where d is the orientation or dipole vector of the dipole moment. Thus, the radiative power of a dipole is greatest when the dipole is aligned with the field E and "0" when not aligned. In addition, the total power radiated by the dipole is simply proportional to the sum over all modes of frequency v of $|d \cdot E|^2$. By changing the EM environment near a dipole, such as introducing an optical cavity or other resonant element, modes of a first frequency domain of frequency $v_1$ can be transferred to a second frequency domain of frequency $v_2$ depleting the number (or rather density) of modes in the first frequency domain and increasing the number of modes in the second frequency domain. When this happens, a dipole oscillating at frequency $v_1$ decays slower because of the reduced number of modes available for it to decay into. In contrast, a dipole oscillating at frequency $v_2$ decays faster because of the increased number of modes available for it to decay into.

The Purcell factor, given by:

$$F_p = \frac{SE \text{ rate of a dipole in complex environment}}{SE \text{ rate of the dipole in bulk material}}$$

where the complex environment refers to the QW, and the bulk material refers to the surrounding material, such as the n-type and p-type heterostructures, can be used to measure the SE rate. The larger the Purcell factor, the faster the SE rate.

Figure 12:
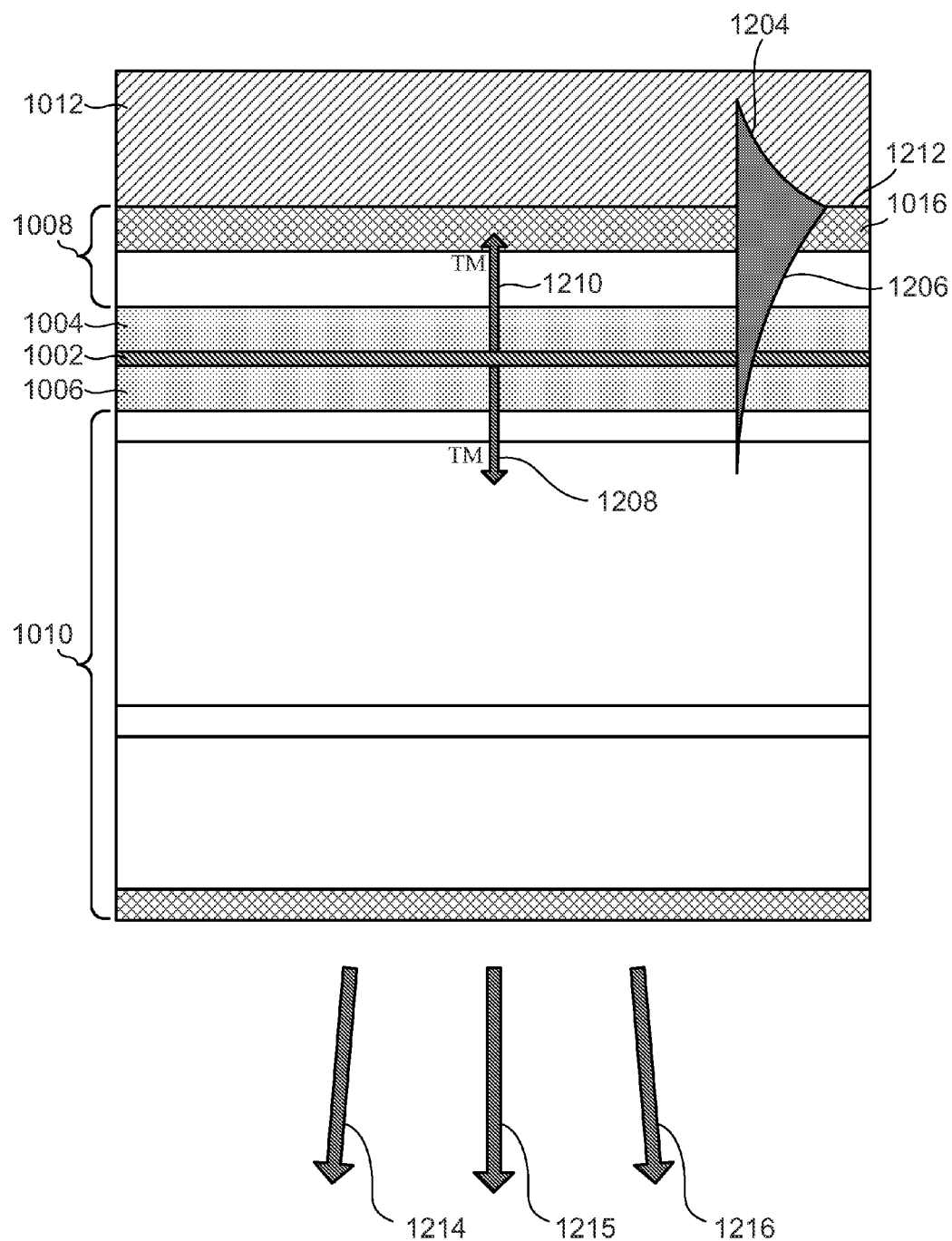
FIG. 12 shows a cross-sectional view of the light-emitting diode, shown in FIG. 10, operated in accordance with embodiments of the present invention.

FIG. 12 shows a cross-sectional view of the LED 1000 operated in accordance with embodiments of the present invention. The SE rate of recombining electronic-holes pairs (i.e., dipoles) in the QW 1002 is not an intrinsic property of the QW 1002 semiconductor material alone. Instead, as described above, the SE rate of the recombining electronic-holes pairs depends on the electromagnetic environment of the QW 1002. In particular, the SE rate of the QW 1002 depends on the local density of states of the electromagnetic vacuum field at the position of the QW 1002, which is a measure of the number and strength of propagating optical modes to which the QW 1002 can couple. In order to change the electromagnetic environment of the recombining electronic-holes pairs and increase the SE rate of the QW 1002, SPPs are formed along the interface 1212 between the metal structure 1012 and the second n-type semiconductor layer 1016. A voltage is applied to the LED 1000, as described with reference to FIG. 11, and light is emitted as a result of electron-hole recombination. This light causes the formation of SPPs along the interface 1212. The SPPs increase the electron-hole recombination rate, which results in the emission of light from the LED 1000 and increases the formation of SPPs. The interface 1202 supports SPP modes, which are quantized states of electron excitations existing on the surface of a metal and are manifest as electron-plasma oscillations that have both longitudinal and transverse electromagnetic field components. The magnetic field component is approximately parallel to the interface 1202 and approximately perpendicular to the propagation direction, while the electric field component is perpendicular to the interface 1202 and parallel to the direction of the SPP propagation direction at the wavelength of interest.

In the present invention, the presence of the metal-dielectric interface 1212 near the recombining dipoles (i.e., electron-hole pairs) of the QW 1002 is able to alter the mode density at the QW frequency in such a way that its SE rate can be increased by a factor of at least 10. The interface 1212 supports the optical SPP modes with a dispersion described by an effective (complex) refractive index:

$$n_{\text{eff}} = \left[\frac{\varepsilon_m \varepsilon}{\varepsilon_m + \varepsilon}\right]^{\frac{1}{2}}$$

where $\in_m$, and $\in$ refer to the (complex) dielectric constants of the metal and the dielectric material, respectively, and are in a frequency range just above the plasma frequency of the metal where the real part of $\in_m$ is substantially negative. The SPP has a very intense electric field E within a few tens of nanometers from the interface 1212. In fact, this field may be so intense that the SPP mode alone is able to collect a major part of the dipole SE decay, accounting by itself for the large SE rate increase. The LED 1000 is configured so that the QW 1002 is close enough to the interface 1202 that the electron-plasma oscillations of an SPP extend into the QW 1002. For example, the QW 1002 can be about 20-30 nm from the interface 1212. In FIG. 12, curve 1204 represents the extent to which the electric field E component of the electron-plasma oscillations penetrates into the metal structure 1012, and curve 1206 represents the extent to which the electric field component of the electron-plasma oscillations penetrates through the n-type heterostructure 1008 and into the QW 1002. Curves 604 and 606 show how the electric field components decay exponentially away from the interface 1202. The SPPs have high density electric fields leading to a substantial increase in the recombination rate of electron-hole pairs within the QW 1002. Because the QW 1002 is tensile strained, the corresponding valance band structure is modified such that the LH sub-band is higher in electronic energy than the HH sub-band, as described above with reference to FIGS. 8 and 9. As a result, the rate at which electrons transition from the conduction band to the LH band of the QW 1002 is enhanced by emitting predominantly transverse magnetic field ("TM") component polarized radiation while suppressing the transverse electric field ("TE") component. The quantum well 1002 is chosen so that the emission wavelength from the QW 1002 is longer than the SPP resonance of the metal. This reduces the absorption loss of the SPP, allowing it to propagate a longer distance along the metal-semiconductor interface. The plasmon enhanced LED 1000 is operated in the regime far enough away from the surface plasmon resonance and still able to produce an enhancement in the recombination rate.

The main resonance of the SPP is the frequency for which the real part of $\in_m$ is exactly the opposite of $\in$. At the main resonance, both the real and imaginary part of $n_{\text{eff}}$ become very large, with a value only limited by the residual absorption in the metal or the dielectric. The density of modes, which describes the number of SPP modes within a fixed (infinitesimal) frequency range also becomes very large. Using low-loss noble metals for the metal structure 1012, such as Silver or Gold, results in a large Purcell factor of about 1000, for all orientations of the QW dipole moment. However, because the imaginary part of $n_{\text{eff}}$ is also large, the SPP is rapidly absorbed in the host metal where it is dissipated as heat, hence it does not allow the efficient collection of the SE light from the QW. Embodiments of the present invention are configured to address this problem in two ways. First, the SPP is used away from its main resonance, in order to produce a moderate Purcell factor in the regime of about 10. As a result, the SPP actually propagates on the metal surface for a few light wavelengths before dissipating. This also allows the re-radiation of the SPP into free space modes which can be accomplished by patterning the surface of the metal structure 1012 in the appropriate way, such as using a grating or roughness, as described below with reference to FIG. 13. In addition, when the SPP is used away from its main resonance, the SPP couples almost exclusively to the TM dipole of the QW 1002, which is oriented perpendicular to the metal surface and the QW 1002. This precludes the use of standard QW using the conduction band to HH valence band transition which is exclusively TE in nature. Second, a tensile-strained QW 1002 is used as described above. A tensile-strained QW 1002 has a dipole moment that is preferentially TM, and couples well with the SPP mode. The combination of using the SPP away from its main resonance and the tensile strained QW 1002 provides a way to enhance the SE rate of the LED 1000 by a factor of 10 while maintaining a large external efficiency.

As shown in FIG. 12, TM polarized radiation can be emitted approximately perpendicular to the plane of the QW 1002, as indicated by directional arrows 1208 and 1210. The precise radiation pattern depends on the roughness of the metal-dielectric interface and other factors. The TM polarized radiation directed toward the metal structure 1012 is reflected back and output through the p-type heterostructure 1010, as indicated by directional arrows 1214-1216.

As long as an appropriate voltage is applied in the same forward bias direction, as shown in FIG. 11, electrons flow through the n-type heterostructure 1008 toward the QW 1002, and holes flow through the p-type heterostructure 1010 toward the QW 1002, where the electrons spontaneously recombine at the QW 1002 and TM polarized radiation is emitted. The rate at which the electrons recombine with the holes is increased considerably by the presence of SPPs created along the interface 1212. As a result, the LED 1000 can emit light with a modulation speed of about 10 Gb/s or faster while maintaining a radiative efficiency in excess of about 20%.

Figure 13:
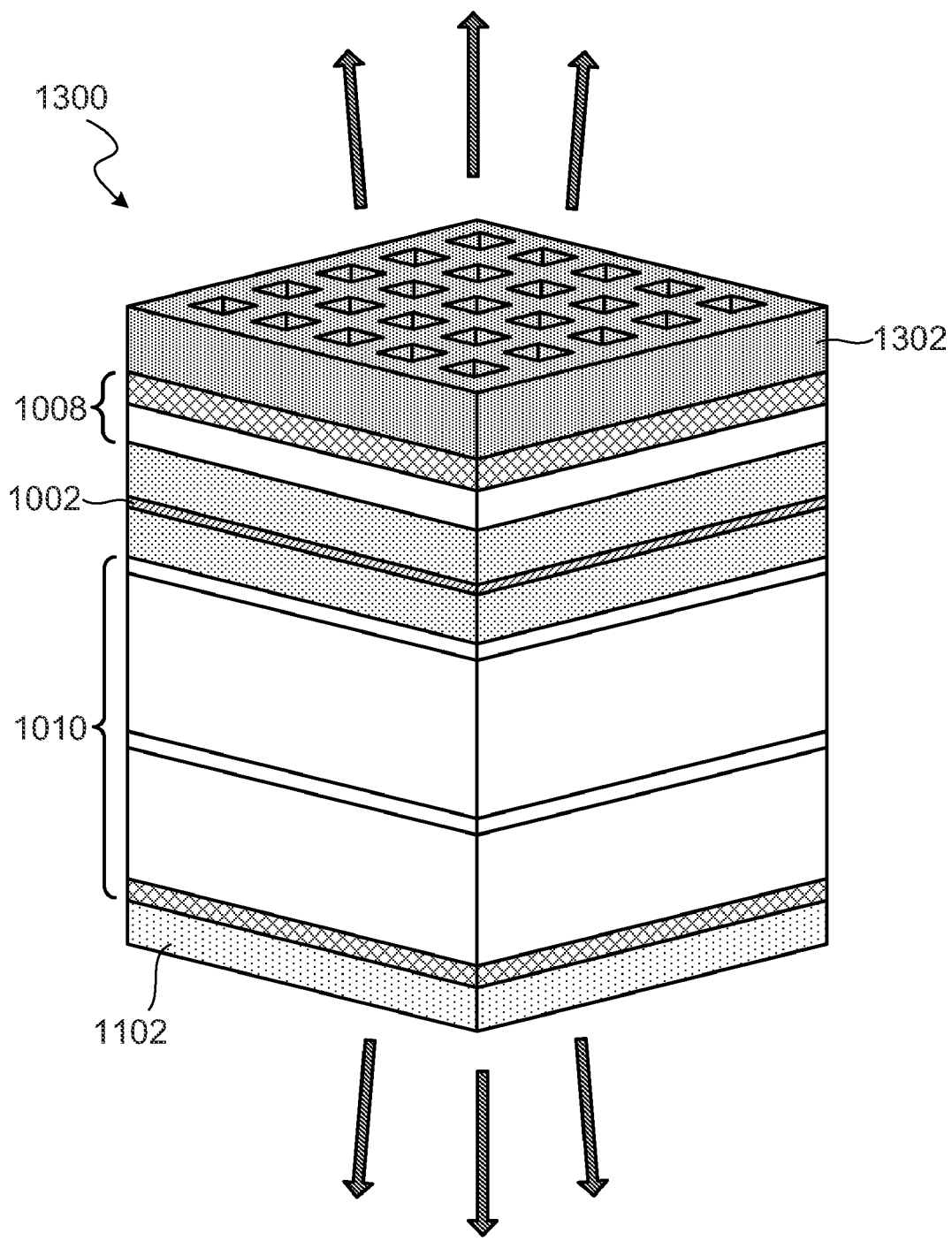
FIG. 13 shows an isometric view of a second light-emitting diode configured in accordance with embodiments of the present invention.

The metal structure 1012 can be comprised of gold, silver, aluminum, platinum, copper, or another suitable metal or an alloy thereof that is able to support plasmon modes at the frequency of interest. The metal structure 1012 can also be configured with a flat top surface, as shown in FIGS. 10-12, or the metal structure 1012 can be configured with a grating designed to radiate the SPPs generated at the interface 1202 into free-space and may increase the radiative efficiency of the LED 1000. FIG. 13 shows an isometric view of a second LED 1300 configured in accordance with embodiments of the present invention. As shown in FIG. 13, the metal structure 1302 includes a grating comprising an array of regularly spaced rectangular holes. In other embodiments of the present invention, the holes can be round, elliptical, rectangular, or any other suitable shape, and the holes can be arranged in a regular pattern or arranged in any suitable pattern that enables the TM polarized radiation to be emitted through the grating as shown in FIG. 13.

Figure 14A:
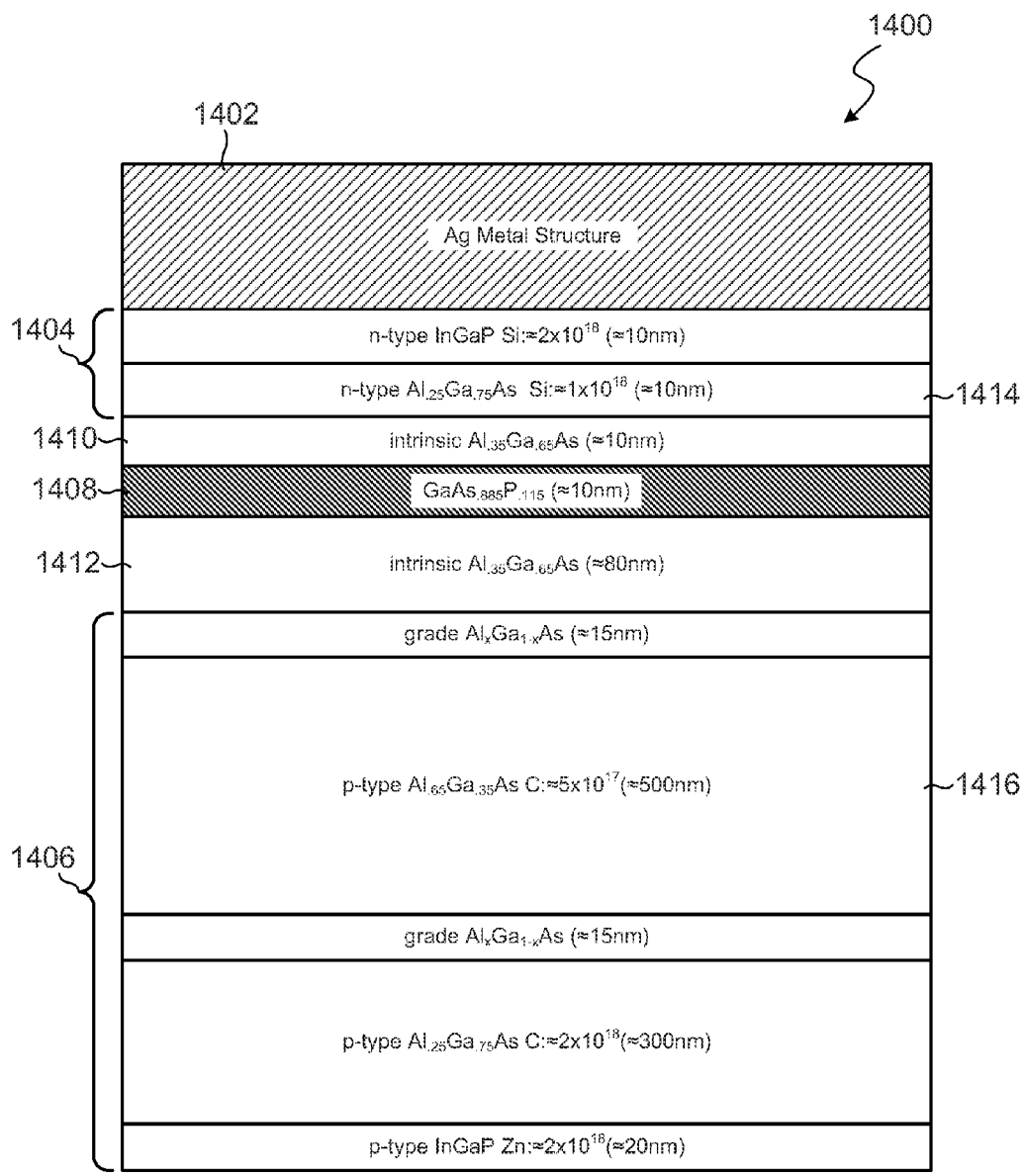
FIG. 14A shows a schematic representation and cross-sectional view of a third light-emitting diode configured in accordance with embodiments of the present invention.

In certain embodiments of the present invention, an LED can be configured to emit TM polarized radiation with a wavelength of about 800 nm. FIG. 14A shows a cross-sectional view of an LED 1400 configured to emit TM polarized radiation with a wavelength of about 800 nm in accordance with embodiments of the present invention. The LED 1400 includes Ag metal structure 1402, a two layer n-type heterostructure 1404, and a five layer p-type heterostructure 1406. The LED 1400 also includes an intrinsic $GaAs_{.885}P_{.115}$ QW 1408 having an approximate thickness of 10 nm sandwiched between a first intrinsic $Al_{.35}Ga_{.65}As$ layer 1410 having an approximate thickness of 10 nm and a second intrinsic $Al_{.35}Ga_{.65}As$ layer 1412 having an approximate thickness of 80 nm. FIG. 14A reveals the compositions, approximate dopant concentrations, and approximate thicknesses of the layers comprising the n-type and p-type heterostructures 1404 and 1406. For example, layer 1414 is approximately 10 nm thick and comprises $Al_{.25}Ga_{.75}As$ doped with approximately $2\times10^{18}$ Si atoms/cm$^3$, and layer 1416 is approximately 500 nm thick and comprises $Al_{.65}Ga_{.35}As$ doped with approximately $5\times10^{17}$ C atoms/cm$^3$. The LED can be formed by removing the substrate on which it is grown—for example GaAs, since the substrate adds loss and reduces the efficiency of the LED. To this end, an etch stop layer such as AlAs can be epitaxially grown so that the LED layers can be removed from the substrate after it is bonded to another substrate. Thus, the LED is fabricated by performing metal-to-metal bonding to a carrier substrate such as silicon or silicon carbide followed by substrate removal, resulting in a thin epitaxial layer which can be processed into an LED.

Figure 14B:
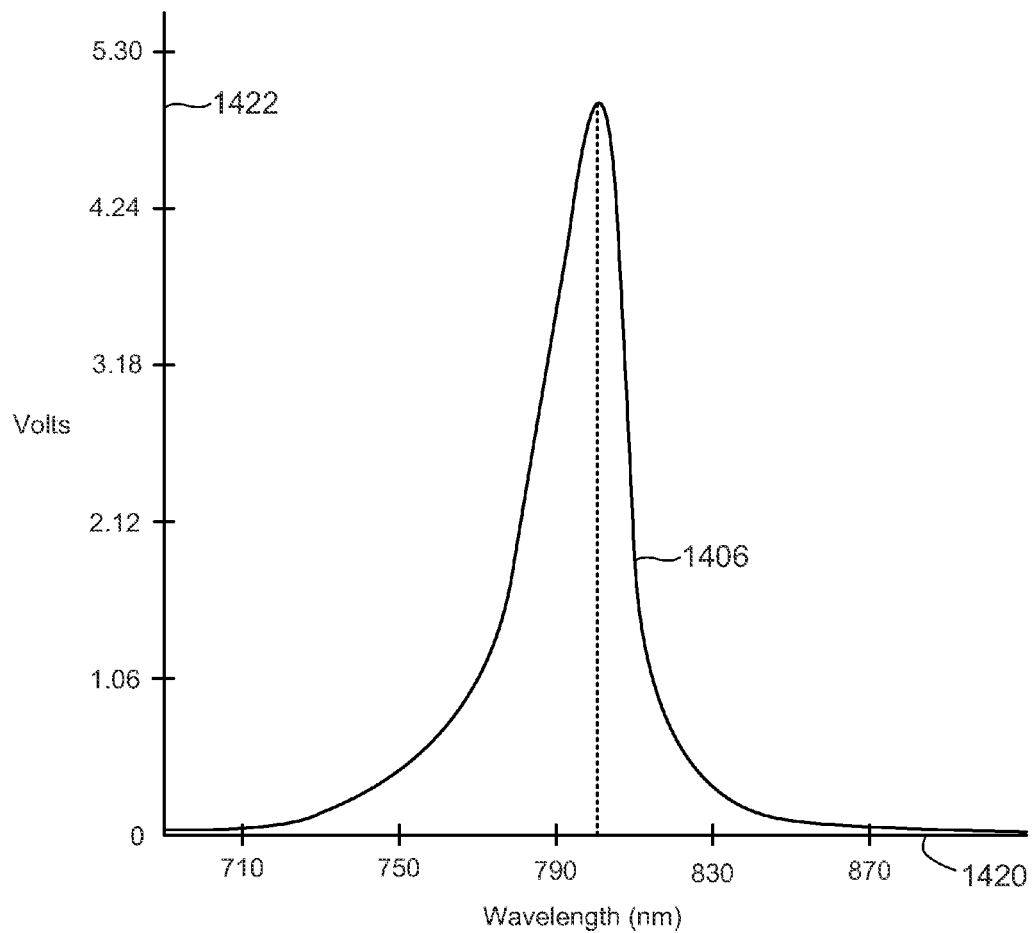
FIG. 14B shows a plot of a photoluminescence spectrum associated with the light-emitting diode, shown in FIG. 14A, in accordance with embodiments of the present invention.

FIG. 14B shows a plot of a photoluminescence spectrum associated with the LED 1400 (without the Ag metal structure 1402) in accordance with embodiments of the present invention. As shown in FIG. 14B, a horizontal axis 1420 represents the wavelength of light in nanometers, a vertical axis 1422 represents the photoluminescence in volts, and curve 1406 represents the photoluminescence of the LED 1400. The curve 1406 was determined using a Rigorous Coupled-Wave Analysis simulation adapted from L. Li, *JOSA A*, 14, 2758 (1997). The peak of the curve 1406 indicates that an LED configured in accordance with the LED 1400, emits TM polarized radiation with a wavelength of about 800 nm and a narrow line width of about 24 nm. The SPP-enhanced LED 1400 can emit light with a modulation speed of about 10 Gb/s or faster while maintaining a radiative efficiency above about 20%.

Figure 15:
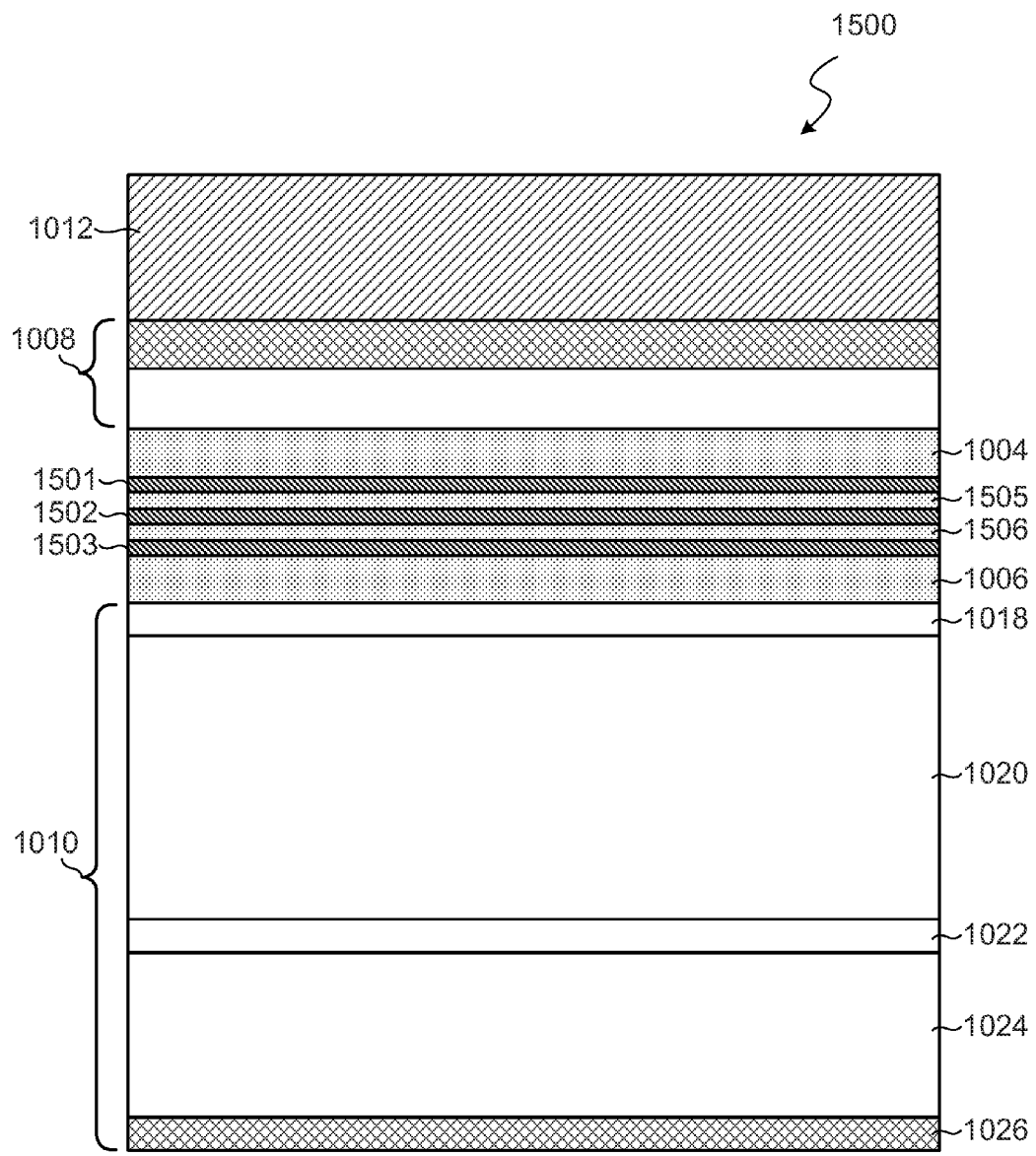
FIG. 15 shows a schematic representation and cross-sectional view of a fourth light-emitting diode configured in accordance with embodiments of the present invention.

Embodiments of the present invention are not limited to a single QW. In other embodiments of the present invention, any number of QWs can be used, provided the QWs are close enough to the metal so that they couple to the electron-plasma oscillations of SPPs formed along the metal structure interface. FIG. 15 shows a schematic representation and cross-sectional view of an LED 1500 configured in accordance with embodiments of the present invention. The LED 1500 is nearly identical to the LED 1000 except the LED 1500 includes three QWs 1501-1503 that are located within the electron-plasma oscillations of SPPs formed along the interface 1202. The QWs 1501-1503 are separated by layers 1505 and 1506, which can be about 5 nm thick and can be comprised of the same intrinsic semiconductor material comprising the layers 1004 and 1006 or a different semiconductor material.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A light-emitting diode comprising:
   at least one quantum well sandwiched between a first intrinsic semiconductor layer and a second intrinsic semiconductor layer;
   a first heterostructure disposed on a surface of the first intrinsic semiconductor layer;
   a second heterostructure disposed on a surface of the second intrinsic semiconductor layer, wherein the second heterostructure is located opposite the first heterostructure; and
   a metal structure disposed on a surface of the light-emitting diode, wherein electron-plasma oscillations of surface plasmon polaritons formed along the interface between the metal structure and the surface of the light-emitting diode extend into the at least one quantum well increasing the spontaneous emission rate of the transverse magnetic field component of electromagnetic radiation emitted from the at least one quantum well via the Purcell effect,
   wherein the second heterostructure comprises: a first compositionally graded semiconductor layer disposed on the surface of the second intrinsic semiconductor layer;
   a first intermediate semiconductor layer disposed on a surface of the first compositionally graded semiconductor layer; and
   a second compositionally graded semiconductor layer disposed on a surface of the first intermediate semiconductor layer.

2. The light-emitting diode of claim 1 wherein the at least one quantum well further comprises a tensile strained intrinsic semiconductor.

3. The light-emitting diode of claim 1 wherein the at least one quantum well further comprises a thickness of about 10 nm.

4. The light-emitting diode of claim 1 wherein the at least one quantum well further comprises $GaAs_{1-x}P_x$, where x ranges from 0 to 1.

5. The light-emitting diode of claim 1 wherein the first intrinsic semiconductor layer and the second intrinsic semiconductor layer further comprise intrinsic $Al_xGa_{1-x}As$, where x ranges from 0 to 1.

6. The light-emitting diode of claim 1 wherein the first heterostructure further comprises:
   a first semiconductor layer disposed on the surface of the first intrinsic semiconductor layer; and
   a second semiconductor layer sandwiched between the metal structure and the first semiconductor layer, wherein the first semiconductor layer has a relatively lower electronic energy band gap than the second semiconductor layer.

7. The light-emitting diode of claim 6 wherein the first semiconductor layer further comprises an n-type $Al_xGa_{1-x}As$ layer having an n-type dopant concentration of about $10^{18}$ and x ranges from about 0 to about 1, and the second semiconductor layer further comprises an n-type InGaP layer having a n-type dopant concentration of about $2\times10^{18}$.

8. The light-emitting diode of claim 6 wherein the first semiconductor layer further comprises an p-type $Al_xGa_{1-x}As$ layer having a p-type dopant concentration of about $10^{18}$ and x ranges from about 0 to about 1, and the second semiconductor layer further comprises an p-type InGaP layer having a p-type dopant concentration of about $2\times10^{18}$.

9. The light-emitting diode of claim 1 wherein the second heterostructure further comprises: a second intermediate semiconductor layer disposed on a surface of the second compositionally graded semiconductor layer; and a third semiconductor layer disposed on a surface of the second intermediate semiconductor layer.

10. The light-emitting diode of claim 9 wherein the first intermediate semiconductor layer further comprises $Al_xGa_{1-x}As$ having a p-type dopant concentration of about $5\times10^{17}$ and x ranges from about 0 to about 1, the second intermediate semiconductor layer further comprises $Al_xGa_{1-x}As$ having a p-type dopant concentration of about $2\times10^{18}$ and x ranges from about 0 to about 1, and the third semiconductor layer further comprises InGaP having a p-type dopant concentration of about $2\times10^{18}$.

11. The light-emitting diode of claim 9 wherein the first intermediate semiconductor layer further comprises $Al_xGa_{1-x}As$ having an n-type dopant concentration of about $5\times10^{17}$ and x ranges from about 0 to about 1, the second intermediate semiconductor layer further comprises $Al_xGa_{1-x}As$ having an n-type dopant concentration of about $2\times10^{18}$ and x ranges from about 0 to about 1, and the third semiconductor layer further comprises InGaP having an n-type dopant concentration of about $2\times10^{18}$.

12. The light-emitting diode of claim 1 wherein the first and second compositionally graded semiconductor layers further comprise $Al_xGa_{1-x}As$, where x ranges from about 0 to 1.

13. The light-emitting diode of claim 1 wherein the first and second compositionally graded semiconductor layers have a relatively larger electronic energy band gap than the first and second intermediate semiconductor layers.

14. The light-emitting diode of claim 1 further comprises a layer of indium tin oxide disposed on a surface of the light-emitting diode opposite the metal structure.

15. The light-emitting diode of claim 1 wherein the metal structure further comprises a metal supporting surface plasmon, the metal supporting surface plasmon is one selected from the group consisting of: gold; silver; aluminum; platinum; copper; and an alloy thereof.

16. The light-emitting diode of claim 1 wherein the metal structure further comprises a grating.

17. The light-emitting diode of claim 1 wherein the metal structure further comprises an outer roughened surface.

18. The light-emitting diode of claim 1 further comprises a modulation speed of about 10 Gb/s or faster and a Purcell factor on the order of about 10.

19. The light-emitting diode of claim 1 wherein the at least one quantum well is about 20-30 nm away from the interface.

* * * * *